United States Patent
Cushman et al.

(10) Patent No.: US 6,587,064 B2
(45) Date of Patent: *Jul. 1, 2003

(54) SIGNAL PROCESSOR WITH LOCAL SIGNAL BEHAVIOR AND PREDICTIVE CAPABILITY

(75) Inventors: Matthew Cushman, Santa Clara, CA (US); Aleksander Ignjatovic, Mountain View, CA (US)

(73) Assignee: Kromos Communications, Inc., Fremont, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/897,325

(22) Filed: Jul. 2, 2001

(65) Prior Publication Data

US 2002/0000929 A1 Jan. 3, 2002

Related U.S. Application Data

(63) Continuation-in-part of application No. 09/614,886, filed on Jul. 9, 2000, which is a continuation-in-part of application No. 09/144,360, filed on Aug. 31, 1998, now Pat. No. 6,115,726.
(60) Provisional application No. 60/143,074, filed on Jul. 9, 1999, provisional application No. 60/087,006, filed on May 28, 1998, and provisional application No. 60/061,109, filed on Oct. 3, 1997.

(51) Int. Cl.$^7$ .................................................. H03M 1/12
(52) U.S. Cl. ...................................... 341/155; 341/107
(58) Field of Search .......................... 341/155; 708/702, 708/300, 309, 311

(56) References Cited

U.S. PATENT DOCUMENTS 6,115,726 A * 9/2000 Ignjatovic .................. 708/300

FOREIGN PATENT DOCUMENTS

WO    WO/99 18666    4/1999    .......... H03H/21/00

* cited by examiner

Primary Examiner—Brian Young
(74) Attorney, Agent, or Firm—Campbell Stephenson Ascolese LLP; Samuel G. Campbell, III (57) ABSTRACT

A signal processor and method of signal processing is disclosed. The signal processor includes a differentiator and an extrapolator coupled to the differentiator. The differentiator is configured to receive an input signal and to generate a vector. The input signal is band-limited. The vector includes at least one chromatic derivative. The extrapolator is coupled to the differentiator and is configured to generate an output signal.

187 Claims, 6 Drawing Sheets

SIGNAL PROCESSOR WITH LOCAL SIGNAL BEHAVIOR AND PREDICTIVE CAPABILITY

CROSS-REFERENCE TO RELATED APPLICATIONS

This patent application is a continuation-in-part of Patent Application Ser. No. 09/614,886, filed Jul. 9, 2000 (which claims priority to Provisional Patent Application Ser. No. 60/143,074 (filed Jul. 9, 1999), which are assigned to Kromos Communications, Inc., the assignee of the present application. These applications and patent are incorporated herein by reference, in their entirety and for all purposes.

This patent also claims priority to a Provisional Patent Application Ser. No. 60/296,063, filed Jun. 5, 2001, having M. Cushman and A. Ignjatovic as inventors, and which is assigned to Kromos Communications, Inc., the assignee of the present application. This application is incorporated herein by reference, in its entirety and for all purposes.

BACKGROUND OF THE INVENTION

1. Field of the Invention

The invention relates to a signal processor with local signal behavior and predictive capability. In particular, the invention provides a method and apparatus for sampling an input signal, determining characteristics of the signal and predicting future characteristics of the signal.

2. Description of the Related Art

Many conventional signal processing techniques are known in the art. Many of these techniques include time domain and frequency domain computation and analysis. Popular examples of such computation and analysis includes Fourier expansion and Fourier transforms as described in U.S. Pat. No. 6,115,726.

While there are known techniques for computing and analyzing a signal, these conventional techniques are insufficient to manage high data rates that are naturally part of the communication revolution occurring in advanced technology. For example, communication standards are now being implemented in the range of 40 gigabits per second, which several years ago would have seemed nearly impossible to achieve. In this context, there are specific features that are important and those are described as follows.

Given a signal up to a time L, it would be advantageous to know some information about the future behavior of the signal. This general problem has several different interpretations: first, it could be a question regarding an estimate of the signal's value at some future time t>L; second, it could be a question regarding an estimate of several derivatives $f^{(i)}(L)$ of f(t) at the time limit L; or third, one can even combine these cases, asking for an estimate of derivatives of f(t) at a future time $f^{(i)}(t)$. Ideally, answers to these questions should extract parameters of the signal which allow one to easily vary the time, t, and order of differentiation, i.

SUMMARY OF THE INVENTION

In one embodiment of the present invention, a method of predicting the behavior of an input signal is disclosed. The input signal is a band-limited analog signal. The method includes representing the input signal as a truncated series at a first time. The first time is at or before a time limit. The truncated series includes local signal behavior parameters (LSBPs). The method also includes predicting the behavior of the input signal using the LSBPs.

In an aspect of this embodiment, the method also includes calculating the LSBPs by fitting the truncated series to discrete signal samples at a second time. This second time is before the time limit.

In another embodiment of the present invention, a method of predicting the behavior of an input signal is disclosed. The method includes representing the signal as a first truncated series at a first time. The input signal is a band-limited analog input signal. The first time is at or before a time limit. The first truncated series includes a first number of local signal behavior parameters (LSBPs). The method also includes calculating the first number of LSBPs by fitting the first truncated series to discrete signal samples and representing the input signal as a second truncated series at a second time. The second time is after the first time, and the second truncated series includes a second number of LSBPs. The method further includes calculating the second number of LSBPs by simultaneously fitting the second truncated series to discrete samples of the input signal at points in time less than the time limit, and values of the input signal and derivatives of the input signal about the first time, wherein the values are determined by the first number of LSBPs. The method still further includes predicting the behavior of the input signal using the second number of LSBPs.

In another embodiment of the present invention, a signal processor is disclosed. The signal processor includes a differentiator and an extrapolator coupled to the differentiator. The differentiator is configured to receive an input signal and to generate a vector. The input signal is band-limited. The vector includes at least one chromatic derivative. The extrapolator is coupled to the differentiator and is configured to generate an output signal.

The foregoing is a summary and thus contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION OF THE INVENTION

The following is intended to provide a detailed description of an example of the invention and should not be taken to be limiting of the invention itself. Rather, any number of variations may fall within the scope of the invention which is defined in the claims following the description.

The present invention provides a method and apparatus for sampling an input signal, determining characteristics of the signal and predicting future characteristics of the signal. The exemplary embodiments are described herein with reference to specific structure and function. Those skilled in the art will appreciate that various changes and modifications can be made to the exemplary embodiments while remaining within the scope of the present invention.

Figure 1:
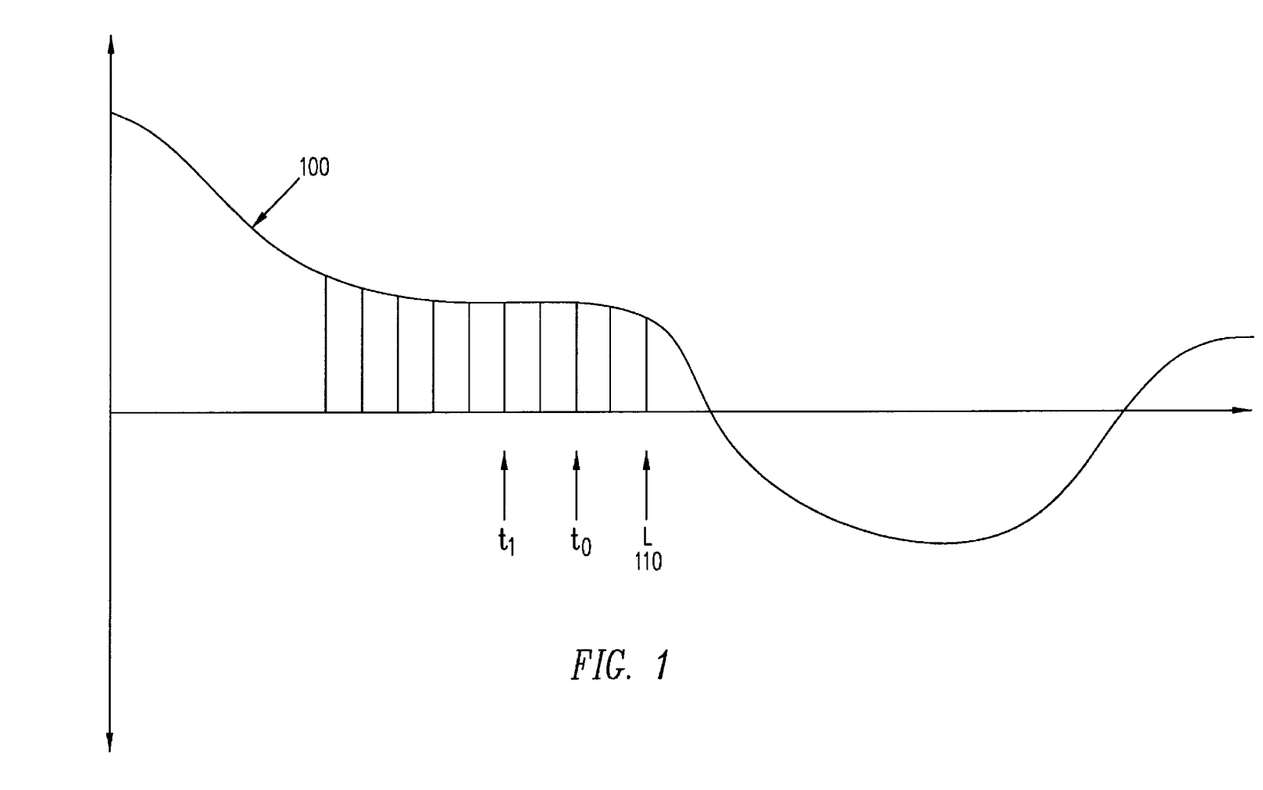
FIG. 1 is a graph illustrating an input signal showing a time limit L.

FIG. 1 is a graph depicting an input signal 100 and a time limit 110 (also referred to herein as a time limit L, or more simply, L). Input signal 100 may be described by a function f. The goal of a portion of previous patent applications by the assignee of the present patent application is to estimate and characterize an input signal such as input signal 100. U.S. Pat. No. 6,115,726 and patent application Ser. No. 09/614,886, describe how to effectively and accurately make such estimations in the presence of noise by using chromatic derivatives (the coefficients of which are also referred to herein as local signal behavior parameters (LSBPs)). Chromatic derivatives are an efficient local representation of a band-limited signal in terms of derivatives. These chromatic derivatives can be calculated either from discrete samples of the signal (sampled at a rate above the Nyquist rate), or from the analog signal itself using integration. An important point is that derivatives close to or at time L can be accurately estimated, given only the signal value at times $t \leq L$. Using these derivatives, one can extrapolate the value of the function f or its chromatic derivatives, and hence its ordinary derivatives, at times greater than L.

An overview of such methods is now presented. First, an admissible family of polynomials $p_i$, orthonormal with respect to weight w are fixed. The chromatic expansion of a band-limited signal f is the following sum:

$$f(t_0 + \delta) = \sum_{i=0}^{\infty} CD(f, t_o, i) B_i(\pi \delta)$$

where CD is the family of differential operators having $p_i$ as transfer function and the function $B_i$ is a generic base function (here, the Fourier transform of w $p_i$). A Bessel function (denoted $J_i$) can be used, among other functions, in the stead of $B_i$. This sum converges pointwise, with an explicit error bound $e(\delta)$ given in terms of the family $p_i$ and the norm of the Fourier transform of f with respect to the scalar product defined by w.

Suppose one is given the value of f at points $t_0-nr$, $t_0-(n-1)r, \ldots, t_0, \ldots, t_0+nr$, where $t_0$ is less than or equal to L. The expansion on the right hand side of the above equation can be truncated at some finite stage N, and an attempt made to fit the data points to a linear combination of that form. Methods for doing this are described in U.S. Pat. No. 6,115,726; the terms in the sum should be weighted by a factor (referred to herein as the window) which accounts for the truncation error $e(\delta)$. This fit can be performed using an analog representation of an input signal f. In this case, expanding the integral of the square of the difference between f and the truncated expansion (times the window) yields a finite system of linear equations, with the constant terms depending on input signal f, but with the coefficients of the chromatic derivatives constant. This matrix can be inverted in advance, yielding an expression for the chromatic derivatives in terms of integrals of the form $\int f(t) B_i(\pi t) dt$. These integrals can then be calculated, for example, by an analog integrator. For example, using Bessel functions (denoted by $J_{84}$), the truncated series can be formed by summing scalar multiples of functions of the form $J_{\nu+k}(t)/t^\nu$, corresponding to a case of ultraspherical polynomials described by $P^{(\nu-\frac{1}{2}, \nu-\frac{1}{2})}$.

One approach is to use a filter (e.g., an FIR filter) for this function. The goal is to derive the optimal linear estimate of a filtered signal H(f) at the point 0 given samples of other filters $G_1(f) \ldots G_k(f)$ at 0. This method is optimal in the sense of least error variance for stationary Gaussian signals in stationary Gaussian noise (neither necessarily white).

Two cases are particularly relevant to the problem of prediction. First is the case where the filter to be estimated H(f) is CD(k,f) and each of the filters $G_i(f)$ is a shift (time delay) of f. This essentially approximates CD(k,f,t0) as a FIR filter, as noted. For the second, H(f) is again CD(k,f), but the filters $G_i$ consist of samples of f at various points in addition to delays of CD(k,f). This corresponds to the calculation of an edge differentiator in terms of an interior differentiator plus samples. In order to discuss this technique, the following notation is employed:

f Gaussian WSS signal
n Gaussian WSS noise
$R_f$ autocorrelation function of f
$S_f$ power spectral density (PSD) of f
$R_n$ autocorrelation function of n
$S_n$ PSD of n
H transfer function of target filter
$G_k$ transfer functions of source filters For example, if a source filter samples at time -t, the corresponding $G_k$ is $e i \omega t$.

It is assumed that f and g are independent jointly wide sense stationary Gaussian random processes. The goal is to find coefficients $c_i$ which minimize:

$$E[H(f)(0) - \Sigma c_j G_j(f+n)(0)]^2$$

Algebra yields:

$$(H(f) - \Sigma c_i G_i(f+n))^2 = ((H - \Sigma c_i G_i)(f) - \Sigma c_i G_i(n))^2 = (H - \Sigma c_i G_i)(f)^2 - 2(H - \Sigma c_i G_i)(f)(\Sigma c_i G_i)(n) + (\Sigma c_i G_i)(n)^2$$

If the expected value of this process is determined, the middle term vanishes because that term is a product of independent processes. The first term is the autocorrelation function of a Gaussian random process obtained by filtering the signal f; the last term is the autocorrelation of another process obtained by filtering n. The processes have power spectra given by:

$$(H - \Sigma c_i G_i)^2 S_f$$

$$(\Sigma c_i G_i)^2 S_n$$

respectively.

The expected value of this quantity evaluated at 0 is the sum of the autocorrelation functions at 0. This is:

$$\int [(H - \Sigma c_i G_i)^2 S_f + (\Sigma c_i G_i)^2 S_n] d\omega$$

Applying standard minimization techniques this can be rewritten as a linear equation:

$$M.c = v$$

where $c=(c_i)$ is the coefficient vector, M is a matrix with entries given by:

$$M_{ij} = \int G_i G_j (S_f + S_n) d\omega$$

and v is a vector given by $$v_i = \int G_i H S_f d\omega$$

To obtain the coefficients $c_i$, one proceeds by calculating the matrix M and the vector v, inverting M, and then multiplying this inverse with the vector v.

It will be noted that, in practice, M can be a poorly conditioned matrix. In that case, calculating $c_i$ using the method in the previous paragraph can require precision arithmetic, and the coefficients $c_i$ may end up being quite large. Fortunately, the noise terms in the matrix M tend to make M better conditioned, especially with regard to white noise terms in the case of a sampling filter. In addition, numerical techniques can be used to find M-1.v without actually inverting M.

Figure 2:
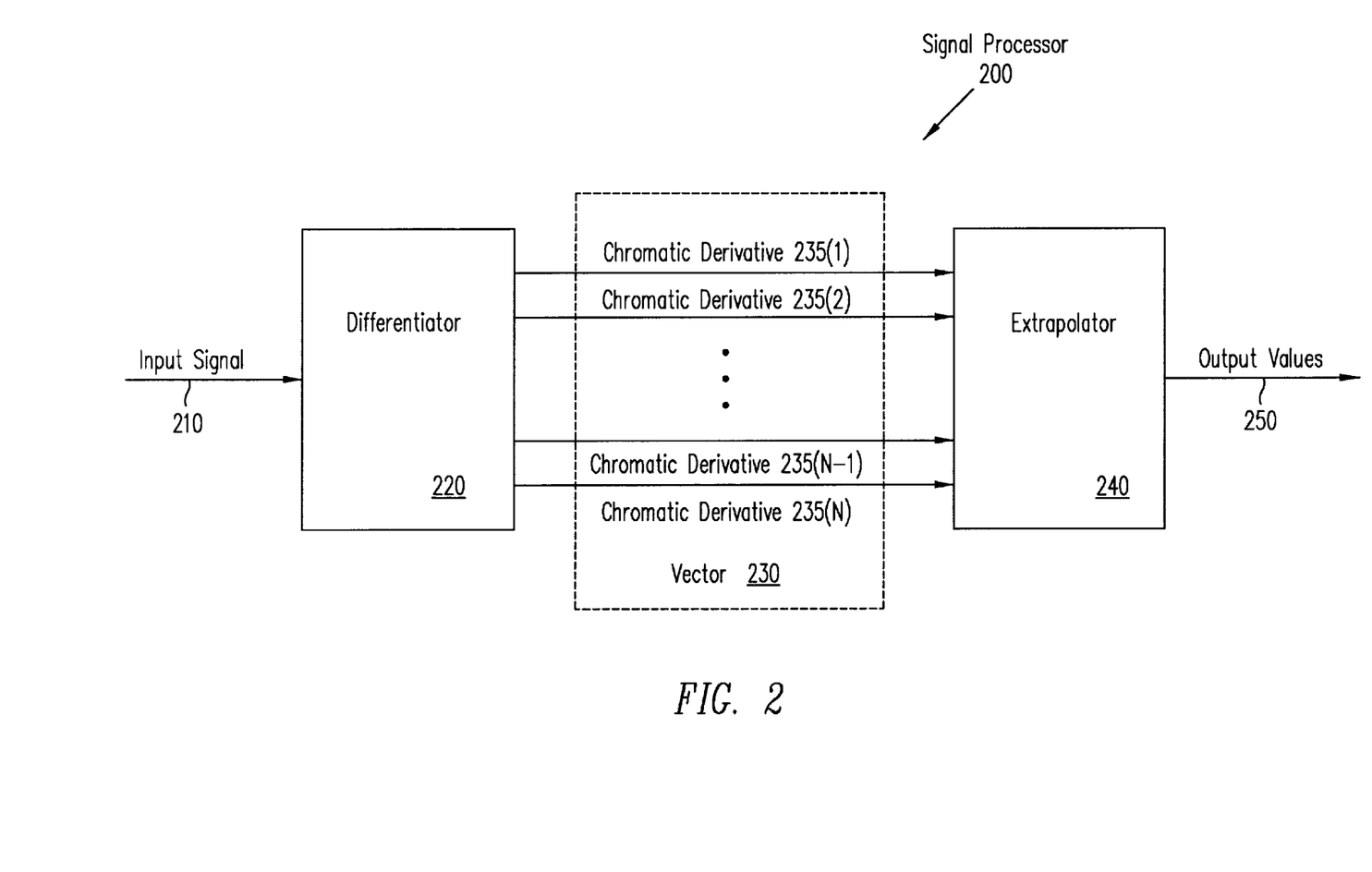
FIG. 2 is a block diagram illustrating a processor for processing the input signal according to an embodiment of the present invention.
Figure 3A:
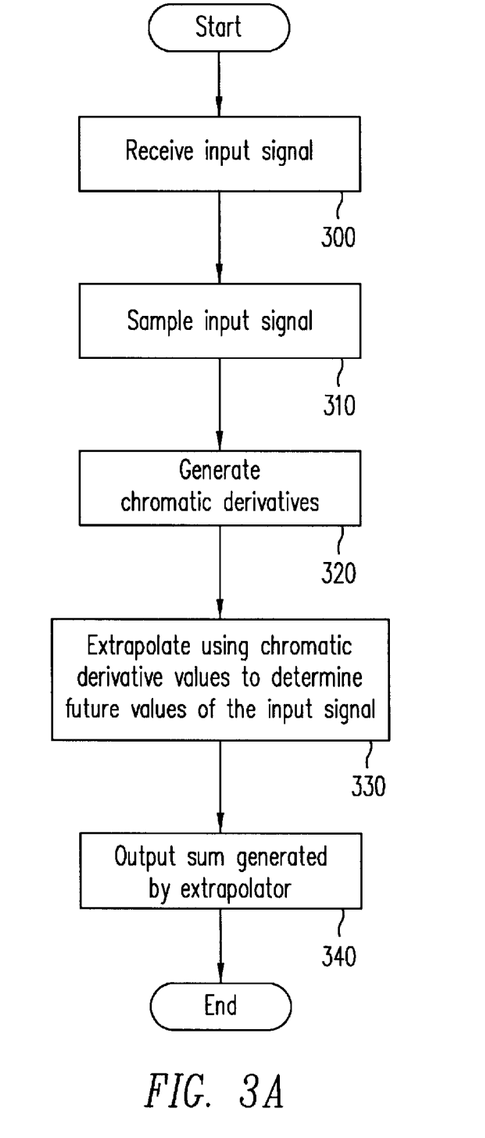
FIGS. 3A and 3B are a flow diagrams illustrating the actions taken in operating the embodiment of the present invention shown in FIG. 2.
Figure 3B:
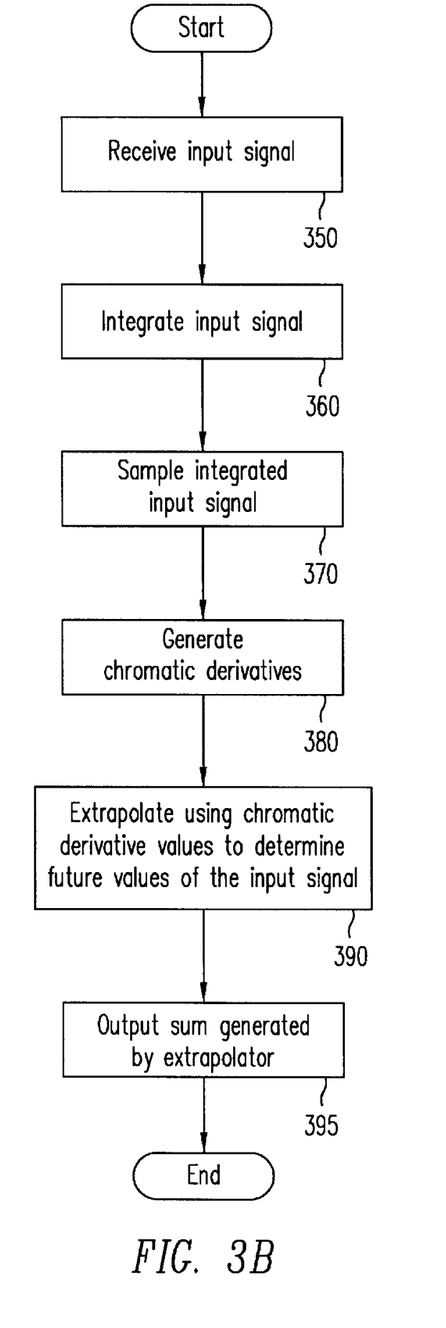

FIG. 2 depicts a signal processor 200 capable of processing an input signal 210 according to an embodiment of the invention, and more specifically shows the data flow through signal processor 200. A band-limited signal f(t) (depicted in FIG. 2 as input signal 210) is received by a differentiation module 220. Differentiation module 220 may be implemented in various ways, for instance, using the methods described in U.S. Pat. No. 6,115,726. Two methods are described in that patent (with variations), one using oversampling of the data (which is depicted in FIG. 3A, as described below) and the other using analog integration (which is depicted in FIG. 3B, also as described below). Such sampling can be performed by a sampling circuit (not shown) that samples input signal 210. Such a sampling circuit can, for example, generate a number of multi-bit digital samples of input signal 210. Alternatively, an analog integrator (also not shown) can be positioned before differentiation module 220. One difficulty, referring back to FIG. 1, is to accurately evaluate enough of the chromatic derivatives at a point $t_0$ at or sufficiently close to the time limit L ($t_0$ thus being less than or equal to L) so that these parameters yield information about the behavior of the signal at a time after L.

The output from differentiation module 220 is a vector 230 (a vector of N+1 quantities, chromatic derivatives 235(1)–(N)). Chromatic derivatives 235(1)–(N) are estimates for the values of the first N chromatic derivatives of input signal 210 (the band-limited signal f(t)) at the point $t_0$ (also referred to herein as the sampling time). Chromatic derivatives 235(1)–(N) are received by an extrapolator 240, which converts information regarding chromatic derivatives 235(1)–(N) of input signal 210 at point $t_0$ to predict information about input signal 210 (or the chromatic derivatives of input signal 210) at a different point. This value is then output from extrapolator 240 as output values 250. This process is described in greater detail with regard to FIGS. 3A and 3B.

In the embodiment described above, different components are contained within different other components (e.g., various of the elements of signal processor 200). It is to be understood that such depicted architectures are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

It will also be noted that the variable identifier "N" is used in FIG. 2 to more simply designate the final element (e.g., chromatic derivatives 235(1)–(N)) of a series of related or similar elements (e.g., chromatic derivatives). The repeated use of such variable identifiers is not meant to imply a correlation between the sizes of such series of elements, although such correlation may exist. The use of such variable identifiers does not require that each series of elements has the same number of elements as another series delimited by the same variable identifier. Rather, in each instance of use, the variable identified by "N" may hold the same or a different value than other instances of the same variable identifier.

FIG. 3A is a flow diagram of the operation of an embodiment of the present invention according to the architecture shown in FIG. 2. A band-limited signal f(t) (input signal 210) is received by differentiation module 220 (step 300). As noted, differentiation module 220 may employ, for example, a method (with variations) described in U.S. Pat. No. 6,115,726, that entails the use of oversampling of input signal 210 (step 310 in FIG. 3A). Next, differentiation module 220 generates vector 230 (a vector of N+1 quantities, chromatic derivatives 235(1)–(N)) (step 320). As noted, chromatic derivatives 235(1)–(N) are estimates for the value of the first N chromatic derivatives of input signal 210 (the band-limited signal f(t)) at the point $t_0$.

Chromatic derivatives 235(1)–(N) are then fed into an extrapolator 240. Extrapolator 240 converts information about chromatic derivatives 235(1)–(N) of input signal 210 (the band-limited signal f(t)) at point $t_0$ to predict information about input signal 210 (or the chromatic derivatives of input signal 210) at a different point (step 330). The information produced by this technique includes at least three different types of information:

1. chromatic derivatives of the band-limited signal f(t) at the time limit L;
2. values of the band-limited signal f(t) at points t>L; or
3. chromatic derivatives of the band-limited signal f(t) at points t>L.

In all three cases, extrapolator 240 performs a similar calculation. The input data $c_i$ (i.e., chromatic derivatives 235(1)–(N)) determine an expansion of CD(f,k,t) of order N-k. The case k=0 corresponds to the function value (the value of input signal 210 (the band-limited signal f(t))) where the expansion is simply the usual truncated expansion. Extrapolator 240 calculates the appropriate sum, which is a linear combination of a plurality of $c_i$ and interpolation functions $B_i$ evaluated at the point t-L (step 330). This value is then output from extrapolator 240 as output values 250 (step 340). It will be noted that, generally, $t_0$ need not be equal to L.

FIG. 3B is a flow diagram of the operation of another embodiment of the present invention according to the architecture shown in FIG. 2. Again, a band-limited signal f(t) (input signal 210) is received by differentiation module 220 (step 350). As noted, differentiation module 220 may employ, for example, a method (with variations) described in U.S. Pat. No. 6,115,726, that entails the use of analog integration of the data (step 360 in FIG. 3B). Next, the result of the integration is sampled (step 370). Differentiation module 220 then generates vector 230 (chromatic derivatives 235(1)–(N), as noted) (step 380).

Chromatic derivatives 235(1)–(N) are then fed into an extrapolator 240. Extrapolator 240 operates as previously described, converting information about chromatic derivatives 235(1)–(N) at point $t_0$ to predict information about input signal 210 (or the chromatic derivatives of input signal 210) at a different point (step 390). Extrapolator 240 generate the appropriate sum, as described above in connection with FIG. 3A, which includes at least the three different types of information thus described (step 390). This value is then output from extrapolator 240 as output values 250 (step 395).

Each of the blocks of the flow diagram of FIGS. 3A and 3B, and those depicted in subsequent figures, may be executed by a module (e.g., a software module) or a portion of a module or a computer system user. The methods described herein, the operations thereof and modules for performing such methods may therefore be executed on a computer system configured to execute the operations of the method and may be executed from computer-readable media. The method may be embodied in a machine-readable and computer-readable medium for configuring a computer system to execute the method. The software modules may be stored within and transmitted to a computer system memory to configure the computer system to perform the functions of the module. Alternatively, such actions may be embodied in the structure of circuitry that implements such functionality, such as the micro-code of a complex instruction set computer (CISC), firmware programmed into programmable or erasable/programmable devices, the configuration of a field-programmable gate array (FPGA), the design of a gate array or full-custom application-specific integrated circuit (ASIC), or the like.

Those skilled in the art will also recognize that the boundaries between modules and operations depicted herein are merely illustrative and alternative embodiments may merge such modules or operations, or impose an alternative decomposition of functionality thereon. For example, the actions discussed herein may be decomposed into sub-operations to be executed as multiple computer processes. Moreover, alternative embodiments may combine multiple instances of a particular operation or sub-operation. Furthermore, those skilled in the art will recognize that the operations described in exemplary embodiment are for illustration only. Operations may be combined or the functionality of the operations may be distributed in additional operations in accordance with the invention. As will also be apparent to those of skill in the art, methods described herein may employ other techniques (similar in effect to those described herein) to make such determinations, and such alternative techniques are intended to be comprehended by the methods and apparati discussed herein.

Figure 4:
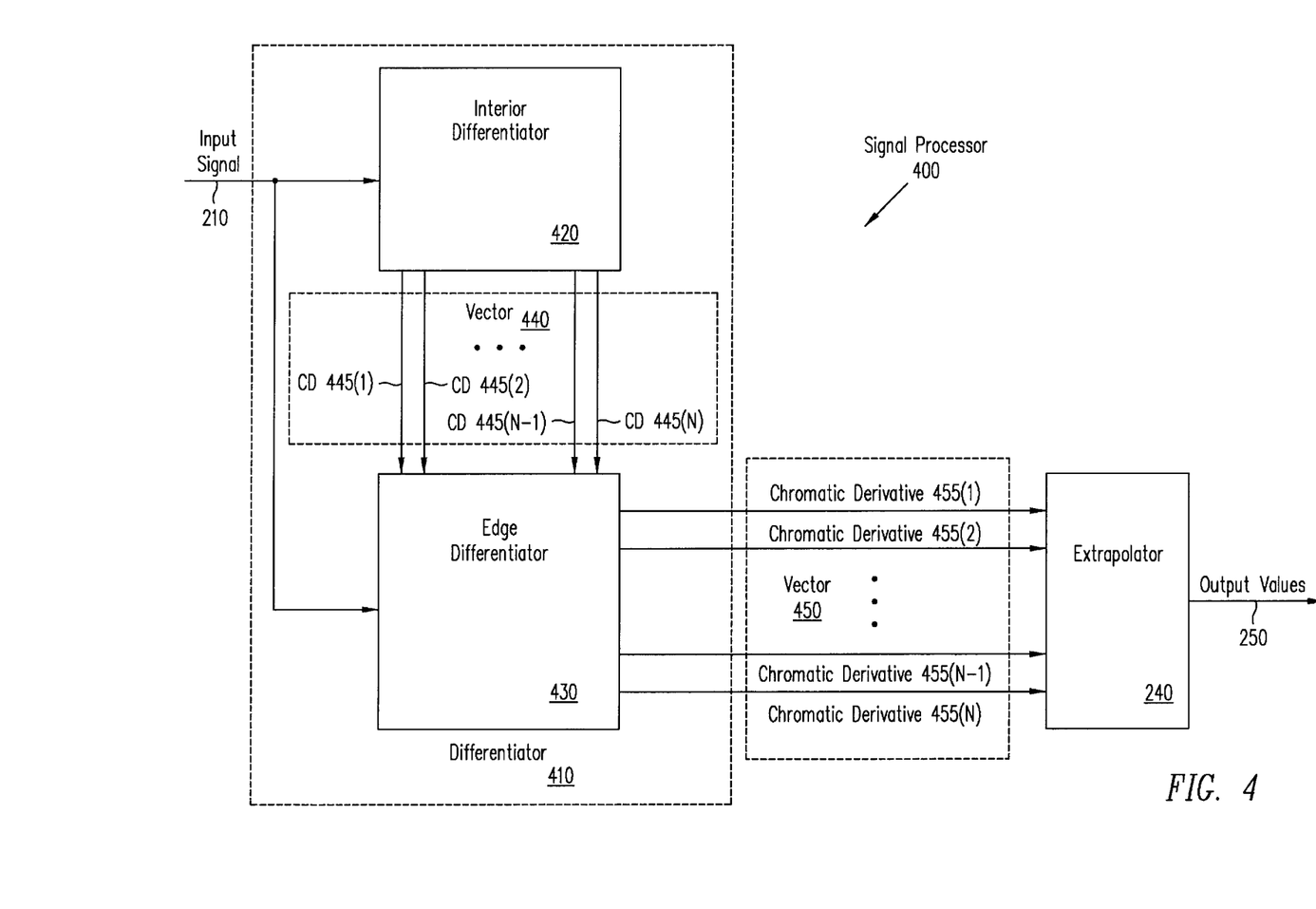
FIG. 4 is a block diagram illustrating a processor configured to process the input signal in the presence of noise according to an embodiment of the present invention.

FIG. 4 depicts a signal processor 400 according to an embodiment of the invention that is capable of processing input signal 210 in the presence of noise, showing the data flow through signal processor 400. In the manner of signal processor 200, differentiation module 410 receives a band-limited signal f(t) (input signal 210, as also depicted in FIG. 2 and also referred to with regard to FIGS. 4 and 5 as the function f).

Figure 5:
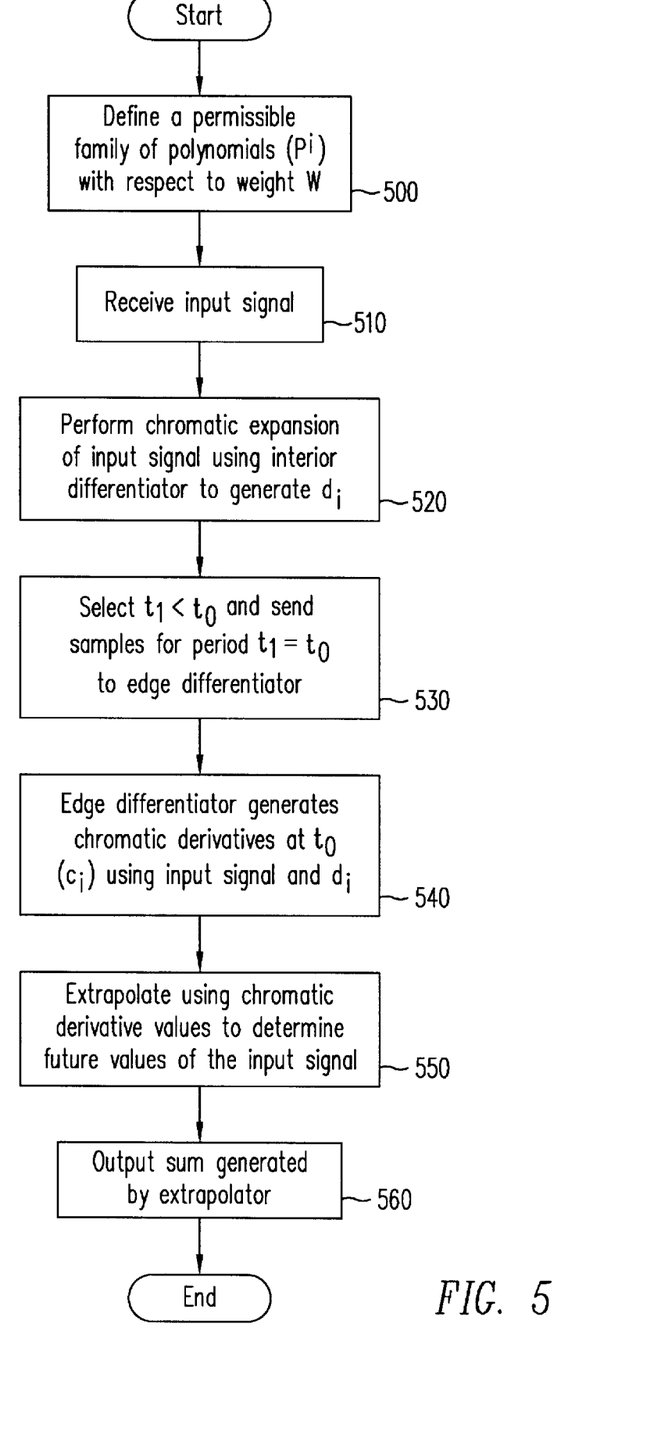
FIG. 5 is a flow diagram illustrating the actions taken in performing the embodiment of the present invention shown in FIG. 4.

The accuracy of a method according to embodiments of the present invention can be improved by first performing the method at an interior point $t_1 < t_0$ (collectively referred to herein as sampling times, as well) sufficiently prior to L (in time) as to allow more accurate evaluation of the chromatic derivatives, as shown in FIGS. 1 and 5. This is accomplished, for example, by choosing $t_1$ such that the upper bound of the interval over which the sum is calculated is the time limit L, as is described in U.S. Pat. No. 6,115,726. To effect this two-step approach, differentiation module 410 is divided into an interior differentiator 420 and an edge differentiator 430. Interior differentiator 420 operates on input signal 210 at a point in time $t_1$, where $t_1$ is chosen such that $t_1$ is sufficiently prior to L (in time) as to allow more accurate evaluation of the chromatic derivatives (e.g., such that the upper bound of the interval over which the sum is calculated is the time limit L).

The output of the interior differentiator 420 is a vector 440 (a vector of N+1 quantities, referred to here as "internal" chromatic derivatives 445(1)–(N)). Differentiation module 410 supplies vector 440 to edge differentiator 430. Edge differentiator 430 also receives input signal 210, and calculates the chromatic derivatives of band-limited signal f(t) (input signal 210), as described below in conjunction with FIG. 5. Edge differentiator 430 is a one-sided differentiator and so estimates the derivatives of input signal 210 at the point $t_0$ given only input signal 210 up to a time $t_0$, or slightly beyond $t_0$. Edge differentiator 430 is typically not symmetric with respect to $t_0$.

The output from edge differentiator 430 (and so differentiation module 410) is a vector 450 (a vector of N+1 quantities, chromatic derivatives 455(1)–(N)). Chromatic derivatives 455(1)–(N) are estimates for the value of, and first N chromatic derivatives of, input signal 210 (the band-limited signal f(t)) at the point $t_0$. Chromatic derivatives 455(1)–(N) are supplied to extrapolator 240, which converts information regarding chromatic derivatives 455(1)–(N) of input signal 210 at point $t_0$ to predict information about input signal 210 (or the chromatic derivatives of input signal 210) at a different point. This value is then output from extrapolator 240 as output values 250. This process is described in greater detail with regard to FIG. 5.

FIG. 5 is a flow diagram of the operation of an embodiment of the present invention according to the architecture shown in FIG. 4. An admissible family of polynomials $p_i$ orthonormal with respect to weight W is defined (step 500). This operation is described in more detail subsequently. In a manner similar to signal processor 200, signal processor 400 receives input signal 210 at differentiation module 410 (step 510). As noted, the accuracy of signal processor 400 can be improved first running the procedure at an interior point $t_1 < t_0$ sufficiently prior to L to allow accurate evaluation of the chromatic derivatives at that point. This operation is performed by internal differentiator 420 (step 520). The output of the interior differentiator 420 (i.e., vector 440) is then sent to edge differentiator 430, together with input signal 210 (i.e., f) (step 530). Edge differentiator 430 is a one-sided differentiator and so estimates the derivatives of input signal 210 at the point $t_0$ given only input signal 210 up to a time $t_0$, or slightly beyond $t_0$.

Edge differentiator 430 calculates the chromatic derivatives of input signal 210 at the point $t_0$ using input signal 210 (in either oversampled or analog format (step 530)), together with vector 440 (the vector of internal chromatic derivatives 445(1)–(N)) as calculated by interior differentiator 420 (step 540). The output of interior differentiator 420 (vector 440, or internal chromatic derivatives 445(1)–(N)) can also be denoted as $d_i$, while the output of edge differentiator 430 can be denoted by $c_i$ (vector 450, or chromatic derivatives 455(1)–(N)), where the latter are the quantities to be calculated.

The values $c_i$ are calculated by minimizing the sum:

$$\sum_{s \in S} \sum_{k=0}^{M} W(k, s-t_0, s-t_1)^2 (Ap(c,k,s-t_0) - Ap(d,k,s-t_1))^2 + \lambda \Omega$$

The function $Ap(c,k,t)$ denotes the value at time t of the approximation of the $k^{th}$ chromatic derivative of input signal 210 (i.e., f), given the vector c (which is a vector of the calculated chromatic derivatives of input signal 210). The function $Ap(d,k,t)$ denotes the value at time t of the approximation of the $k^{th}$ internal chromatic derivative, given the vector d which is the CDs generated by internal differentiator 420. These calculations are discussed in U.S. Pat. No. 6,115,726 and patent application Ser. No. 09/614,886; the exact expression depends on the formula expressing a product of two polynomials in the given family $p_i p_j$ as a linear combination of $p_k$, $0 \leq k \leq i+j$, which in turn depends on the particular family of polynomials (employed in step 500).

The sum measures the error between the approximations corresponding to the expansions around $t_0$ and $t_1$, weighted by the factor $W(k,s)$ (described below). The set S specifies the points at which one tries to force agreement between the interior and edge expansions. The set S is typically a set of equally spaced points between $t_0$ and $t_1$, but can even be simply $T_1$ or $(T_0+t_1)/2$. In fact, an interval can even be used, in which case the finite sum is replaced by an integral; since the variables $c_i$ and $d_i$ only appear as coefficients, these can be calculated in advance. Here, $\Omega$ is the usual sum of squares error for the monad. The parameter $\lambda$ is used to weigh the relative values of the two terms in the sum. The parameter $\lambda$ should be chosen such that the magnitudes of $\lambda \Omega$ and the sum are comparable (i.e., the variances of the two components of the error are substantially equal); this depends on the signal to noise ratio, the order of the truncation, M, and the set S.

The window factor $W(k,s_1,s_2)$ is related to the window that is described in U.S. Pat. No. 6,115,726 when calculating monads. The truncation error bound for a monad of order N-k for input signal 210 (i.e., f) (as given in U.S. Pat. No. 6,115,726) can be defined as e(t). Given this, and using an order of N-k (because the given chromatic expansion of input signal 210 (i.e., f; of order N) is truncated), an expansion of the $k^{th}$ chromatic derivative of input signal 210 (i.e., f) of order N-k is obtained. The window function W is then given by:

$$W(k,s_1,s_2)=1/(1+a(e(s_1)+e(s_2)))$$

where a is a constant determined by the signal to noise ratio, typically between 1 and 100.

As in signal processor 200, differentiation module 410 supplies a vector 450 (a vector of N+1 quantities, chromatic derivatives 455(1)–(N)) to extrapolator 240 (step 550). As before, chromatic derivatives 455(1)–(N) are estimates for the value of, and first N chromatic derivatives of, input signal 210 (the band-limited signal f(t)) at the point $t_0$. Extrapolator 240 converts information regarding chromatic derivatives 235(1)–(N) of input signal 210 at point $t_0$ to predict information about input signal 210 (or the chromatic derivatives of input signal 210) at a different point (step 560). The information produced by this technique includes at least three different types of information:

1. chromatic derivatives of f(t) at the time limit L;
2. values of f(t) at points t>L; or
3. chromatic derivatives of f(t) at points t>L.

In all three cases, extrapolator 240 performs a similar calculation. The input data $c_i$ (i.e., chromatic derivatives 235(1)–(N)) determine an expansion of CD(f,k,t) of order N-k. The case k=0 corresponds to the function value (the value of input signal 210 (the band-limited signal f(t))) where the expansion is simply the usual truncated expansion. Extrapolator 240 calculates the appropriate sum, which is a linear combination of a number of $c_i$ and interpolation functions $J_i$ evaluated at the point t-L (again, step 550). This value is then output from extrapolator 240 as output values 250 (step 560).

Advantages of the invention include the ability to characterize and predict band limited input signals for communication systems. The invention is more efficient and provides predicted results more quickly than conventional techniques. The parameters extracted by the edge differentiator, namely the $CD_i(f, t_0)$, can be efficiently and stably used to estimate $f^{(t)}$ or $f^{(i)}(t)$ for varying points t.

Figure 6:
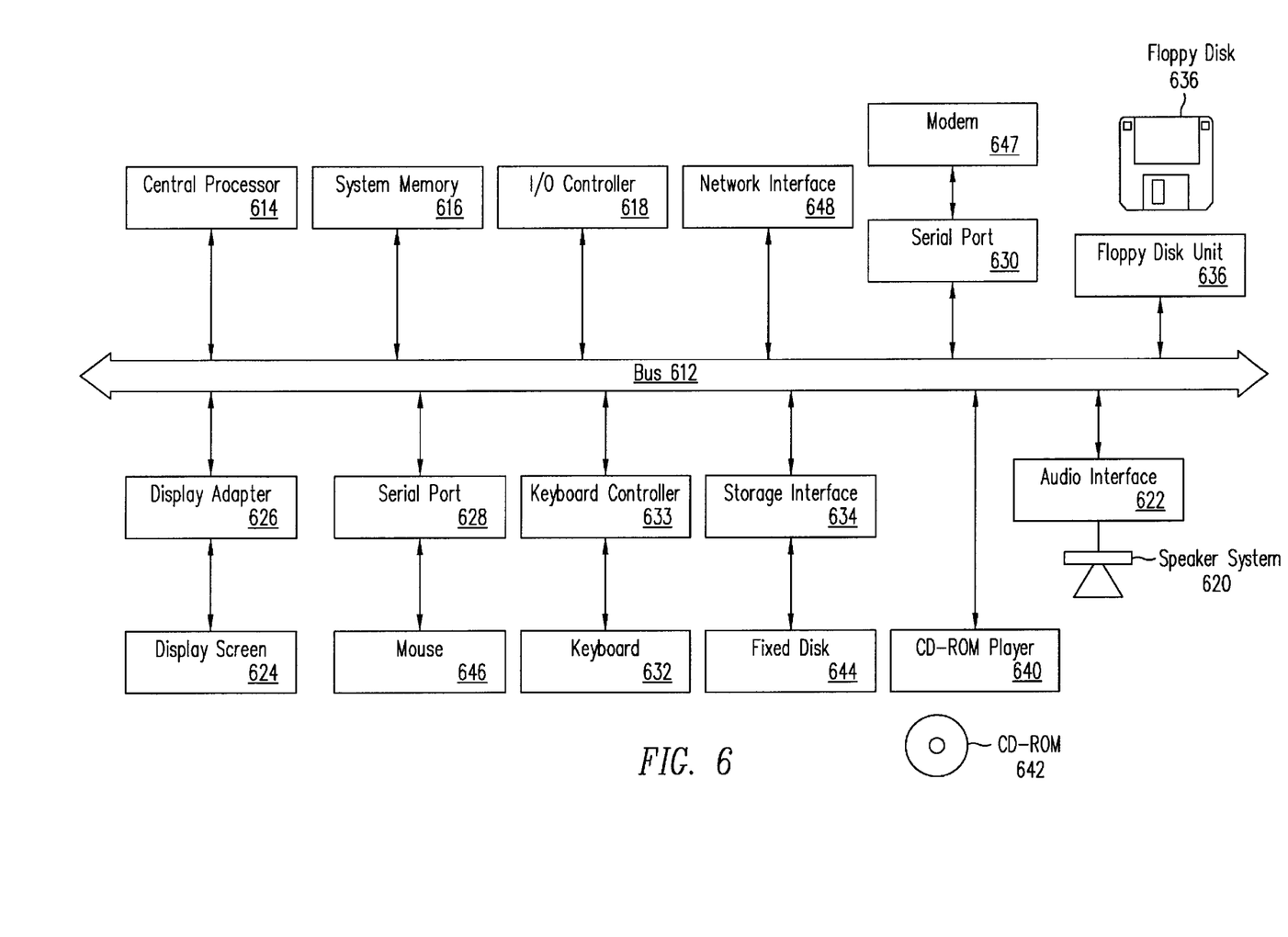
FIG. 6 is a block diagram illustrating a computer in which embodiments of the present invention can be practiced.

FIG. 6 depicts a block diagram of a computer system 610 suitable for implementing software and hardware embodiments of the present invention. Computer system 610 includes a bus 612 which interconnects major subsystems of computer system 610, such as a central processor 614, a system memory 616 (typically RAM, but which may also include ROM, flash RAM, or the like), an input/output controller 618, an external audio device such as a speaker system 620 via an audio output interface 622, an external device such as a display screen 624 via display adapter 626, serial ports 628 and 630, a keyboard 632 (interfaced with a keyboard controller 633), a storage interface 634, a floppy disk drive 636 operative to receive a floppy disk 638, and a CD-ROM drive 640 operative to receive a CD-ROM 642. Also included are a mouse 646 (or other point-and-click device, coupled to bus 612 via serial port 628), a modem 647 (coupled to bus 612 via serial port 630) and a network interface 648 (coupled directly to bus 612).

Bus 612 allows data communication between central processor 614 and system memory 616, which may include both read only memory (ROM) or flash memory (neither shown), and random access memory (RAM) (not shown), as previously noted. The RAM is generally the main memory into which the operating system and application programs are loaded and typically affords at least 16 megabytes of memory space. The ROM or flash memory may contain, among other code, the Basic Input-Output system (BIOS) which controls basic hardware operation such as the interaction with peripheral components. Applications resident with computer system 610 are generally stored on and accessed via a computer readable medium, such as a hard disk drive (e.g., fixed disk 644), an optical drive (e.g., CD-ROM drive 640), floppy disk unit 636 or other storage medium. Additionally, applications may be in the form of electronic signals modulated in accordance with the application and data communication technology when accessed via network modem 647 or interface 648.

Storage interface 634, as with the other storage interfaces of computer system 610, may connect to a standard computer readable medium for storage and/or retrieval of information, such as a fixed disk drive 644. Fixed disk drive 644 may be a part of computer system 610 or may be separate and accessed through other interface systems. Many other devices can be connected such as a mouse 646 connected to bus 612 via serial port 628, a modem 647 connected to bus 612 via serial port 630 and a network interface 648 connected directly to bus 612. Modem 647 may provide a direct connection to a remote server via a telephone link or to the Internet (e.g., via an internet service provider (ISP)). Network interface 648 may provide a direct connection to a remote server via a direct network link to the Internet via a POP (point of presence).

Many other devices or subsystems (not shown) may be connected in a similar manner. Conversely, it is not necessary for all of the devices shown in FIG. 6 to be present to practice the present invention. The devices and subsystems may be interconnected in different ways from that shown in FIG. 6. The operation of a computer system such as that shown in FIG. 6 is readily known in the art and is not discussed in detail in this application. Code to implement the present invention may be operably disposed or stored in computer-readable storage media such as one or more of system memory 616, fixed disk 644, CD-ROM 642, or floppy disk 638.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims.

What is claimed is:

1. A method of predicting behavior of an input signal comprising:
    representing said input signal as a truncated series at a first time, wherein
        said first time is at or before a time limit,
        said truncated series comprises local signal behavior parameters (LSBPs), and
        said input signal is a band-limited analog signal; and
    predicting said behavior of said input signal using said LSBPs.

2. The method of claim 1, further comprising:
    calculating said LSBPs by fitting said truncated series to discrete signal samples at a second time, wherein said second time is before said time limit.

3. The method of claim 2, wherein said calculating is performed in one of a time domain and a frequency domain.

4. The method of claim 2, wherein said second time is equal to said first time.

5. The method of claim 2, wherein
    said first time is prior to said time limit, and
    said predicting predicts said behavior from a time between said first time and said time limit, to a time after said time limit.

6. The method of claim 2, wherein said truncated series comprises n+1 LSBPs.

7. The method of claim 2, further comprising:
    forming said truncated series by summing scalar multiples of a family of functions, wherein
        said family of functions comprises at least one function.

8. The method of claim 7, wherein
    each function of said family of functions is of a form $J_{v+k}(t)/t^v$, corresponding to a case of ultraspherical polynomials described by $P^{(v-\frac{1}{2}, v-\frac{1}{2})}$, and
    $J_v$ denotes a Bessel function.

9. The method of claim 8, wherein said fitting uses a least-squares fitting method.

10. The method of claim 7, wherein said each function of said family of functions is a Bessel function.

11. The method of claim 7, wherein said each function of said family of functions is a spherical Bessel function.

12. The method of claim 7, further comprising:
    generating at least one predicted value of said input signal at a time t using said prediction of said behavior, wherein said time t is greater than said time limit.

13. The method of claim 7, further comprising:
    generating at least one predicted value of a derivative of said input signal at a third time using said prediction of said behavior, wherein said third time is equal to said time limit.

14. The method of claim 13, wherein said derivative of said input signal is a first order derivative of said input signal.

15. The method of claim 13, wherein said derivative of said input signal is a higher-than-first order derivative of said input signal.

16. The method of claim 7, further comprising:
    generating at least one predicted value of a derivative of said input signal at a third time using said prediction of said behavior, wherein said third time is greater than said time limit.

17. The method of claim 16, wherein said derivative of said input signal is a first order derivative of said input signal.

18. The method of claim 16, wherein said derivative of said input signal is a higher-than-first order derivative of said input signal.

19. The method of claim 2, wherein said fitting comprises integrating a product of said input signal with mixing functions in an analog format.

20. A computer system for predicting behavior of an input signal comprising:
    a processor;
    computer readable medium coupled to said processor; and
    computer code, encoded in said computer readable medium, configured to cause said processor to:
        represent said input signal as a truncated series at a first time, wherein
            said first time is at or before a time limit,
            said truncated series comprises local signal behavior parameters (LSBPs), and
            said input signal is a band-limited analog signal; and
        predict said behavior of said input signal using said LSBPs.

21. The computer system of claim 20, wherein said computer code is further configured to cause said processor to:
    calculate said LSBPs by fitting said truncated series to discrete signal samples at a second time, wherein said second time is before said time limit.

22. The computer system of claim 21, wherein
    said first time is prior to said time limit, and
    said predicting predicts said behavior from a time between said first time and said time limit, to a time after said time limit.

23. The computer system of claim 21, wherein said truncated series comprises n+1 LSBPs.

24. The computer system of claim 21, wherein said computer code is further configured to cause said processor to:
    form said truncated series by summing scalar multiples of a family of functions, wherein
        said family of functions comprises at least one function.

25. The computer system of claim 24, wherein
    each function of said family of functions is of a form $J_{v+k}(t)/t^v$, corresponding to a case of ultraspherical polynomials described by $P^{(v-\frac{1}{2}, v-\frac{1}{2})}$, and
    $J_v$ denotes a Bessel function.

26. The computer system of claim 21, wherein said computer code is further configured to cause said processor to:

generate at least one predicted value of said input signal at a time t using said prediction of said behavior, wherein said time t is greater than said time limit.

27. The computer system of claim 21, wherein said computer code is further configured to cause said processor to:
generate at least one predicted value of a derivative of said input signal at a third time using said prediction of said behavior, wherein said third time is equal to said time limit.

28. The computer system of claim 21, wherein said computer code is further configured to cause said processor to:
generate at least one predicted value of a derivative of said input signal at a third time using said prediction of said behavior, wherein said third time is greater than said time limit.

29. The computer system of claim 21, wherein said fitting comprises integrating a product of said input signal with mixing functions in an analog format.

30. A computer program product encoded in computer readable media, said computer program product comprising:
a first set of instructions, executable on a computer system, configured to represent said input signal as a truncated series at a first time, wherein
said first time is at or before a time limit,
said truncated series comprises local signal behavior parameters (LSBPs), and
said input signal is a band-limited analog signal; and
a second set of instructions, executable on said computer system, configured to predict said behavior of said input signal using said LSBPs.

31. The computer program product of claim 30, wherein said computer program further comprises:
a third set of instructions, executable on said computer system, configured to calculate said LSBPs by fitting said truncated series to discrete signal samples at a second time, wherein
said second time is before said time limit.

32. The computer program product of claim 31, wherein said first time is prior to said time limit, and
said predicting predicts said behavior from a time between said first time and said time limit, to a time after said time limit.

33. The computer program product of claim 31, wherein said truncated series comprises n+1 LSBPs.

34. The computer program product of claim 31, wherein said computer program further comprises:
a third set of instructions, executable on said computer system, configured to form said truncated series by summing scalar multiples of a family of functions, wherein
said family of functions comprises at least one function.

35. The computer program product of claim 34, wherein each function of said family of functions is of a form $J_{v+k}(t)/t^v$, corresponding to a case of ultraspherical polynomials described by $P^{(v-\frac{1}{2},\ v-\frac{1}{2})}$, and
$J_v$ denotes a Bessel function.

36. The computer program product of claim 31, wherein said computer program further comprises:
a third set of instructions, executable on said computer system, configured to generate at least one predicted value of said input signal at a time t using said prediction of said behavior, wherein said time t is greater than said time limit.

37. The computer program product of claim 31, wherein said computer program further comprises:
a third set of instructions, executable on said computer system, configured to generate at least one predicted value of a derivative of said input signal at a third time using said prediction of said behavior, wherein said third time is equal to said time limit.

38. The computer program product of claim 31, wherein said computer program further comprises:
a third set of instructions, executable on said computer system, configured to generate at least one predicted value of a derivative of said input signal at a third time using said prediction of said behavior, wherein said third time is greater than said time limit.

39. The computer program product of claim 31, wherein said fitting comprises integrating a product of said input signal with mixing functions in an analog format.

40. An apparatus for predicting behavior of an input signal comprising:
means for representing said input signal as a truncated series at a first time, wherein
said first time is at or before a time limit,
said truncated series comprises local signal behavior parameters (LSBPs), and
said input signal is a band-limited analog signal; and
means for predicting said behavior of said input signal using said LSBPs.

41. The apparatus of claim 40, further comprising:
calculating said LSBPs by fitting said truncated series to discrete signal samples at a second time, wherein
said second time is before said time limit.

42. The apparatus of claim 41, wherein
said first time is prior to said time limit, and
said predicting predicts said behavior from a time between said first time and said time limit, to a time after said time limit.

43. The apparatus of claim 41, further comprising:
forming said truncated series by summing scalar multiples of a family of functions, wherein
said family of functions comprises at least one function.

44. The apparatus of claim 43, wherein
each function of said family of functions is of a form $J_{v+k}(t)/t^v$, corresponding to a case of ultraspherical polynomials described by $P^{(v-\frac{1}{2},\ v-\frac{1}{2})}$, and
$J_v$ denotes a Bessel function.

45. The apparatus of claim 43, further comprising:
generating at least one predicted value of said input signal at a time t using said prediction of said behavior, wherein said time t is greater than said time limit.

46. The apparatus of claim 43, further comprising:
generating at least one predicted value of a derivative of said input signal at a third time using said prediction of said behavior, wherein said third time is equal to said time limit.

47. The apparatus of claim 43, further comprising:
generating at least one predicted value of a derivative of said input signal at a third time using said prediction of said behavior, wherein said third time is greater than said time limit.

48. The apparatus of claim 41, wherein said fitting comprises integrating a product of said input signal with mixing functions in an analog format.

49. A method of predicting behavior of an input signal comprising:

representing said signal as a first truncated series at a first time, wherein
  said input signal is a band-limited analog input signal,
  said first time is at or before a time limit, and
  said first truncated series comprises a first plurality of local signal behavior parameters (LSBPs);
calculating said first plurality of LSBPs by fitting said first truncated series to discrete signal samples;
representing said input signal as a second truncated series at a second time, wherein
  said second time is after said first time, and
  said second truncated series comprises a second plurality of LSBPs;
calculating said second plurality of LSBPs by simultaneously fitting said second truncated series to
  discrete samples of said input signal at points in time less than said time limit, and
  values of said input signal and derivatives of said input signal about said first time, wherein said values are determined by said first plurality of LSBPs; and
predicting said behavior of said input signal using said second plurality of LSBPs.

50. The method of claim 49, wherein said second time is before said time limit.

51. The method of claim 49, wherein said first plurality of LSBPs comprises m+1 LSBPs.

52. The method of claim 49, wherein said second plurality of LSBPs comprises n+1 LSBPs.

53. The method of claim 49, wherein said second time is equal to said time limit.

54. The method of claim 49, wherein said fitting is achieved using a least-squares fitting method.

55. The method of claim 49, further comprising:
forming said truncated series by summing scalar multiples of a family of functions, wherein
  said family of functions comprises at least one function.

56. The method of claim 55, wherein
each function of said family of functions is of a form $J_{v+k}(t)/t^v$, corresponding to a case of ultraspherical polynomials described by $P^{(v-\frac{1}{2},\ v-\frac{1}{2})}$, and
$J_v$ denotes a Bessel function.

57. The method of claim 56, wherein
said fitting uses a least-squares fitting method.

58. The method of claim 55, wherein each function of said family of functions is a Bessel function.

59. The method of claim 55, wherein said each function of said family of functions is a spherical Bessel function.

60. The method of claim 55, further comprising:
generating at least one predicted value of said input signal at a third time using said prediction of said behavior, wherein said third time is greater than said time limit.

61. The method of claim 55, further comprising:
generating at least one predicted value of a derivative of said input signal at a third time using said prediction of said behavior, wherein said third time is equal to said time limit.

62. The method of claim 61, wherein said derivative of said input signal is a first order derivative of said input signal.

63. The method of claim 61, wherein said derivative of said input signal is a higher-than-first order derivative of said input signal.

64. The method of claim 55, further comprising:
generating at least one predicted value of a derivative of said input signal at a third time using said prediction of said behavior, wherein said third time is greater than said time limit.

65. The method of claim 64, wherein said derivative of said input signal is a first order derivative of said input signal.

66. The method of claim 64, wherein said derivative of said input signal is a higher-than-first order derivative of said input signal.

67. The method of claim 49, wherein said fitting comprises integrating said product of said input signal with mixing functions in an analog format.

68. A computer system comprising:
a processor;
computer readable medium coupled to said processor; and
computer code, encoded in said computer readable medium, configured to cause said processor to:
  represent said signal as a first truncated series at a first time, wherein
    said input signal is a band-limited analog input signal,
    said first time is at or before a time limit, and
    said first truncated series comprises a first plurality of local signal behavior parameters (LSBPs);
  calculate said first plurality of LSBPs by fitting said first truncated series to discrete signal samples;
  represent said input signal as a second truncated series at a second time, wherein
    said second time is after said first time, and
    said second truncated series comprises a second plurality of LSBPs;
  calculate said second plurality of LSBPs by simultaneously fitting said second truncated series to
    discrete samples of said input signal at points in time less than said time limit, and
    values of said input signal and derivatives of said input signal about said first time, wherein said values are determined by said first plurality of LSBPs; and
  predict said behavior of said input signal using said second plurality of LSBPs.

69. The computer system of claim 68, wherein said computer code is further configured to cause said processor to:
form said truncated series by summing scalar multiples of a family of functions, wherein
  said family of functions comprises at least one function.

70. The computer system of claim 69, wherein
each function of said family of functions is of a form $J_{v+k}(t)/t^v$, corresponding to a case of ultraspherical polynomials described by $P^{(v-\frac{1}{2},\ v-\frac{1}{2})}$, and $J_v$ denotes a Bessel function.

71. The computer system of claim 69, wherein said computer code is further configured to cause said processor to:
generate at least one predicted value of said input signal at a third time using said prediction of said behavior, wherein said third time is greater than said time limit.

72. The computer system of claim 69, wherein said computer code is further configured to cause said processor to:
generate at least one predicted value of a derivative of said input signal at a third time using said prediction of said behavior, wherein said third time is equal to said time limit.

73. The computer system of claim 69, wherein said computer code is further configured to cause said processor to:

generate at least one predicted value of a derivative of said input signal at a time using said prediction of said behavior, wherein said third time is greater than said time limit.

74. A computer program product encoded in computer readable media, said computer program product comprising:
a first set of instructions, executable on a computer system, configured to represent said signal as a first truncated series at a first time, wherein
said input signal is a band-limited analog input signal,
said first time is at or before a time limit, and
said first truncated series comprises a first plurality of local signal behavior parameters (LSBPs);
a second set of instructions, executable on said computer system, configured to calculate said first plurality of LSBPs by fitting said first truncated series to discrete signal samples;
a third set of instructions, executable on said computer system, configured to represent said input signal as a second truncated series at a second time, wherein
said second time is after said first time, and
said second truncated series comprises a second plurality of LSBPs;
a fourth set of instructions, executable on said computer system, configured to calculate said second plurality of LSBPs by simultaneously fitting said second truncated series to
discrete samples of said input signal at points in time less than said time limit, and
values of said input signal and derivatives of said input signal about said first time, wherein said values are determined by said first plurality of LSBPs; and
a fifth set of instructions, executable on said computer system, configured to predict said behavior of said input signal using said second plurality of LSBPs.

75. The computer program product of claim 74, wherein said computer program product further comprises:
a sixth set of instructions, executable on said computer system, configured to form said truncated series by summing scalar multiples of a family of functions, wherein
said family of functions comprises at least one function.

76. The computer program product of claim 75, wherein each function of said family of functions is of a form $J_{v+k}(t)/t^v$, corresponding to a case of ultraspherical polynomials described by $P^{(v-½, v-½)}$, and
$J_v$ denotes a Bessel function.

77. The computer program product of claim 75, wherein said computer program product further comprises:
a seventh set of instructions, executable on said computer system, configured to generate at least one predicted value of said input signal at a third time using said prediction of said behavior, wherein said third time is greater than said time limit.

78. The computer program product of claim 75, wherein said computer program product further comprises:
a seventh set of instructions, executable on said computer system, configured to generate at least one predicted value of a derivative of said input signal at a third time using said prediction of said behavior, wherein
said third time is equal to said time limit.

79. The computer program product of claim 75, wherein said computer program product further comprises:
a seventh set of instructions, executable on said computer system, configured to generate at least one predicted value of a derivative of said input signal at a third time using said prediction of said behavior, wherein
said third time is greater than said time limit.

80. An apparatus for predicting behavior of an input signal comprising:
means for representing said signal as a first truncated series at a first time, wherein
said input signal is a band-limited analog input signal,
said first time is at or before a time limit, and
said first truncated series comprises a first plurality of local signal behavior parameters (LSBPs);
means for calculating said first plurality of LSBPs by fitting said first truncated series to discrete signal samples;
means for representing said input signal as a second truncated series at a second time, wherein
said second time is after said first time, and
said second truncated series comprises a second plurality of LSBPs;
means for calculating said second plurality of LSBPs by simultaneously fitting said second truncated series to
discrete samples of said input signal at points in time less than said time limit, and
values of said input signal and derivatives of said input signal about said first time, wherein said values are determined by said first plurality of LSBPs; and
means for predicting said behavior of said input signal using said second plurality of LSBPs.

81. The apparatus of claim 80, further comprising:
means for forming said truncated series by summing scalar multiples of a family of functions, wherein
said family of functions comprises at least one function.

82. The apparatus of claim 81, wherein
each function of said family of functions is of a form $J_{v+k}(t)/t^v$, corresponding to a case of ultraspherical polynomials described by $P^{(v-½, v-½)}$, and
$J_v$ denotes a Bessel function.

83. The apparatus of claim 81, further comprising:
means for generating at least one predicted value of said input signal at a third time using said prediction of said behavior, wherein said third time is greater than said time limit.

84. The apparatus of claim 81, further comprising:
means for generating at least one predicted value of a derivative of said input signal at a third time using said prediction of said behavior, wherein
said third time is equal to said time limit.

85. The apparatus of claim 55, further comprising:
means for generating at least one predicted value of a derivative of said input signal at a third time using said prediction of said behavior, wherein
said third time is greater than said time limit.

86. A signal processor, comprising:
a differentiator, configured to receive an input signal and to generate a vector, wherein
said input signal is band-limited, and
said vector comprises at least one chromatic derivative; and
an extrapolator, coupled to said differentiator and configured to generate an output signal.

87. The signal processor of claim 86, further comprising:
a sampling circuit, coupled to said input of said differentiator and configured to sample said input signal.

88. The signal processor of claim 86, further comprising:
an analog integrator, coupled to said input of said differentiator and configured to sample said input signal.

89. The signal processor of claim 86, wherein values of said input signal are available up to a time limit.

90. The signal processor of claim 89, wherein said output signal comprises information regarding derivatives of said input signal at said time limit.

91. The signal processor of claim 89, wherein said output signal comprises information regarding a value of said input signal after said time limit.

92. The signal processor of claim 89, wherein said output signal comprises information regarding derivatives of said input signal after said time limit.

93. The signal processor of claim 86, wherein said vector comprises a plurality of chromatic derivatives.

94. The signal processor of claim 93, wherein said vector comprises N+1 chromatic derivatives, where N is a number of said chromatic derivatives to which a chromatic of said input signal is truncated.

95. The signal processor of claim 93, wherein
said extrapolator is configured to determine a sum,
said sum is a linear combination of said chromatic derivatives and a plurality of interpolation functions.

96. The signal processor of claim 93, wherein
said chromatic derivatives are defined by a chromatic expansion of said input signal according to a sum,
CD is a family of differential operators having a plurality of polynomials as a transfer function,
a function $B_i$ is a Fourier transform of said polynomials multiplied by a windowing function, and
said sum is defined by $$f(t_0 + \delta) = \sum_{i=0}^{\infty} CD(f, t_o, i) B_i(\pi\delta).$$

97. The signal processor of claim 86, wherein said differentiator comprises:
an interior differentiator, coupled to said input and configured to generate a plurality of internal chromatic derivatives; and
an edge differentiator, coupled to receive said internal chromatic derivatives and said input signal.

98. The signal processor of claim 97, wherein
said edge differentiator is configured to generate said vector, a window function is defined by $$W(k,s_1,s_2)=1/(1+a(e(s_1)+e(s_2))),$$

wherein
an error bound is defined by $e(\delta)$, and
a variable a is a constant determined by a signal-to-noise ratio,
said edge differentiator is configured to generate said vector by virtue of being configured to minimize a sum,
said sum is defined by $$\sum_{s \in S} \sum_{k=0}^{M} W(k, s - t_0, s - t_1)^2 (Ap(c, k, s - t_0) - Ap(d, k, s - t_1))^2 + \lambda \Omega.$$

99. The signal processor of claim 97, wherein
said chromatic derivatives are represented by c,
said internal chromatic derivatives are represented by d,
a function Ap(d,k,t) denotes a value at time t of an approximation of a $k^{th}$ chromatic derivative of said input signal, and
a function Ap(d,k,t) denotes a value at time t of a $k^{th}$ internal chromatic derivative.

100. The signal processor of claim 97, wherein said vector comprises a plurality of chromatic derivatives.

101. The signal processor of claim 100, wherein said vector comprises N+1 chromatic derivatives, where N is an order of a truncated expansion and N+1 is a number of said chromatic derivatives to which a chromatic expansion of said input signal is truncated.

102. The signal processor of claim 100, wherein
said extrapolator is configured to determine a sum,
said sum is a linear combination of said chromatic derivatives and a plurality of interpolation functions.

103. The signal processor of claim 100, wherein
said chromatic derivatives are defined by a chromatic expansion of said input signal according to a sum,
CD is a family of differential operators having a plurality of polynomials as a transfer function,
a function $B_i$ is a Fourier transform of said polynomials multiplied by a windowing function, and
said sum is defined by $$f(t_0 + \delta) = \sum_{i=0}^{\infty} CD(f, t_o, i) B_i(\pi\delta).$$

104. A method of predicting behavior of an input signal comprising:
generating a plurality of chromatic derivatives; and
determining a value of said input signal at a first time by extrapolating said input signal to said first time using said chromatic derivatives, wherein
values of said input signal are known up to a time limit, and
said first time is after said time limit.

105. The method of claim 104, wherein said chromatic derivatives are generated by a differentiation module.

106. The method of claim 104, further comprising:
sampling said input signal.

107. The method of claim 104, further comprising:
generating an integrated input signal by integrating said input signal; and
sampling said integrated input signal.

108. The method of claim 104, wherein said determination comprises:
summing values generated by said extrapolation.

109. The method of claim 104, wherein said chromatic derivatives are generated at a second time, and said second time is at or before said time limit.

110. The method of claim 109, further comprising:
representing said input signal as a truncated series at said second time, wherein
said truncated series comprises local signal behavior parameters (LSBPs), and
said input signal is a band-limited analog signal.

111. The method of claim 110, further comprising:
calculating said LSBPs by fitting said truncated series to discrete signal samples at a third time, wherein
said third time is before said time limit.

112. A computer system comprising:
a processor;
computer readable medium coupled to said processor; and
computer code, encoded in said computer readable medium, for predicting behavior of an input signal and configured to cause said processor to:

generate a plurality of chromatic derivatives; and
determine a value of said input signal at a first time by extrapolating said input signal to said first time using said chromatic derivatives, wherein
values of said input signal are known up to a time limit, and
said first time is after said time limit.

113. The computer system of claim 112, wherein said chromatic derivatives are generated by a differentiation module.

114. The computer system of claim 112, wherein said computer code is further configured to cause said processor to:
sample said input signal.

115. The computer system of claim 112, wherein said computer code is further configured to cause said processor to:
generate an integrated input signal by integrating said input signal; and
sample said integrated input signal.

116. The computer system of claim 112, wherein said computer code configured to cause said processor to determine said value of said input signal at said first time is further configured to configured to cause said processor to:
sum values generated by said extrapolation.

117. The computer system of claim 112, wherein said chromatic derivatives are generated at a second time, and said second time is at or before said time limit.

118. The computer system of claim 117, wherein said computer code is further configured to cause said processor to:
represent said input signal as a truncated series at said second time, wherein
said truncated series comprises local signal behavior parameters (LSBPs), and
said input signal is a band-limited analog signal.

119. The computer system of claim 118, wherein said computer code is further configured to cause said processor to:
calculate said LSBPs by fitting said truncated series to discrete signal samples at a third time, wherein
said third time is before said time limit.

120. A computer program product encoded in computer readable media, said computer program product comprising:
a first set of instructions, executable on a computer system, configured to generate a plurality of chromatic derivatives; and
a second set of instructions, executable on said computer system, configured to determine a value of said input signal at a first time by extrapolating said input signal to said first time using said chromatic derivatives, wherein
values of said input signal are known up to a time limit, and
said first time is after said time limit.

121. The computer program product of claim 120, wherein said chromatic derivatives are generated by a differentiation module.

122. The computer program product of claim 120, further comprising:
a third set of instructions, executable on said computer system, configured to sample said input signal.

123. The computer program product of claim 120, further comprising:
a third set of instructions, executable on said computer system, configured to generate an integrated input signal by integrating said input signal; and
a fourth set of instructions, executable on said computer system, configured to sample said integrated input signal.

124. The computer program product of claim 120, wherein said second set of instructions comprises:
a first sub-set of instructions, executable on said computer system, configured to sum values generated by said extrapolation.

125. The computer program product of claim 120, wherein said chromatic derivatives are generated at a second time, and said second time is at or before said time limit.

126. The computer program product of claim 125, further comprising:
a third set of instructions, executable on said computer system, configured to represent said input signal as a truncated series at said second time, wherein
said truncated series comprises local signal behavior parameters (LSBPs), and
said input signal is a band-limited analog signal.

127. The computer program product of claim 126, further comprising:
a third set of instructions, executable on said computer system, configured to calculate said LSBPs by fitting said truncated series to discrete signal samples at a third time, wherein
said third time is before said time limit.

128. An apparatus for predicting behavior of an input signal comprising:
means for generating a plurality of chromatic derivatives; and
means for determining a value of said input signal at a first time by extrapolating said input signal to said first time using said chromatic derivatives, wherein
values of said input signal are known up to a time limit, and
said first time is after said time limit.

129. The apparatus of claim 128, wherein said means for generating said chromatic derivatives comprises a differentiation module.

130. The apparatus of claim 128, further comprising:
means for sampling said input signal.

131. The apparatus of claim 128, further comprising:
means for generating an integrated input signal by integrating said input signal; and
means for sampling said integrated input signal.

132. The apparatus of claim 128, wherein said means for determining comprises:
means for summing values generated by said extrapolation.

133. The apparatus of claim 128, wherein said chromatic derivatives are generated at a second time, and said second time is at or before said time limit.

134. The apparatus of claim 133, further comprising:
means for representing said input signal as a truncated series at said second time, wherein
said truncated series comprises local signal behavior parameters (LSBPs), and
said input signal is a band-limited analog signal.

135. The apparatus of claim 134, further comprising:
means for calculating said LSBPs by fitting said truncated series to discrete signal samples at a third time, wherein
said third time is before said time limit.

136. A method of predicting behavior of an input signal comprising:

defining a family of polynomials;
performing a chromatic expansion of said input signal, wherein
said chromatic expansion results in a vector;
generating a plurality of chromatic derivatives using said vector and said input signal; and
determining a value of said input signal using said chromatic derivatives.

137. The method of claim 136, wherein said chromatic derivatives are generated by performing a one-sided differentiation.

138. The method of claim 136, further comprising:
sampling said input signal, said sampling resulting in a sampled input signal; and
using said sampled input signal in said generation of said chromatic derivatives.

139. The method of claim 138, wherein said sampling said input signal comprises:
generating an integrated input signal by integrating said input signal; and
sampling said integrated input signal, said sampling resulting in said sampled input signal.

140. The method of claim 136, wherein
said chromatic expansion of said input signal is performed at a first time,
said first time is before a second time, and
said second time is at or before a time limit.

141. The method of claim 140, wherein
said value of said input signal is determined at a third time, and
said third time is after said second time.

142. The method of claim 140, wherein said chromatic derivatives are generated at said second time.

143. The method of claim 142, further comprising:
performing a one-sided differentiation to generate said chromatic derivatives.

144. The method of claim 140, wherein said chromatic derivatives are generated using values of said input signal up to said second time.

145. The method of claim 140, wherein said chromatic derivatives are generated using values of said input signal up to a third time, said third time after said second time.

146. The method of claim 145, wherein said third time is equal to said time limit.

147. The method of claim 136, wherein
said family of polynomials are orthonormal with respect to W,
W is defined by $W(k,s_1,s_2)=1/(1+a(e(s_1)+e(s_2)))$.

a is a constant, and
e(t) is a function that describes a truncation error.

148. The method of claim 136, wherein said determination is made by extrapolation and said extrapolation uses said chromatic derivatives.

149. A computer system comprising:
a processor;
computer readable medium coupled to said processor; and
computer code, encoded in said computer readable medium, for predicting behavior of an input signal and configured to cause said processor to:
define a family of polynomials;
perform a chromatic expansion of said input signal, wherein
said chromatic expansion results in a vector;
generate a plurality of chromatic derivatives using said vector and said input signal; and
determine a value of said input signal using said chromatic derivatives.

150. The computer system of claim 149, wherein said chromatic derivatives are generated by performing a one-sided differentiation.

151. The computer system of claim 149, wherein said computer code is further configured to cause said processor to:
sample said input signal, said sampling resulting in a sampled input signal; and
use said sampled input signal in said generation of said chromatic derivatives.

152. The computer system of claim 151, wherein said computer code configured to cause said processor to sample said input signal is further configured to cause said processor to:
generate an integrated input signal by integrating said input signal; and
sample said integrated input signal, said sampling resulting in said sampled input signal.

153. The computer system of claim 149, wherein
said chromatic expansion of said input signal is performed at a first time,
said first time is before a second time, and
said second time is at or before a time limit.

154. The computer system of claim 153, wherein
said value of said input signal is determined at a third time, and
said third time is after said second time.

155. The computer system of claim 153, wherein said chromatic derivatives are generated at said second time.

156. The computer system of claim 155, wherein said computer code is further configured to cause said processor to:
perform a one-sided differentiation to generate said chromatic derivatives.

157. The computer system of claim 153, wherein said chromatic derivatives are generated using values of said input signal up to said second time.

158. The computer system of claim 153, wherein said chromatic derivatives are generated using values of said input signal up to a third time, said third time after said second time.

159. The computer system of claim 158, wherein said third time is equal to said time limit.

160. The computer system of claim 149, wherein
said family of polynomials are orthonormal with respect to W,
W is defined by $W(k,s_1,s_2)=1/(1+a(e(s_2)))$, a is a constant, and
e(t) is a function that describes a truncation error.

161. The computer system of claim 149, wherein said determination is made by extrapolation and said extrapolation uses said chromatic derivatives.

162. A computer program product encoded in computer readable media, said computer program product comprising:
a first set of instructions, executable on a computer system, configured to define a family of polynomials;
a second set of instructions, executable on said computer system, configured to perform a chromatic expansion of said input signal, wherein said chromatic expansion results in a vector;

a third set of instructions, executable on said computer system, configured to generate a plurality of chromatic derivatives using said vector and said input signal; and a fourth set of instructions, executable on said computer system, configured to determine a value of said input signal using said chromatic derivatives.

163. The computer program product of claim 162, wherein said third set of instructions comprises:

a first sub-set of instructions, executable on said computer system, configured to perform a one-sided differentiation to generate said chromatic derivatives.

164. The computer program product of claim 162, further comprising:

a fifth set of instructions, executable on said computer system, configured to sample said input signal, said sampling resulting in a sampled input signal; and a sixth set of instructions, executable on said computer system, configured to use said sampled input signal in said generation of said chromatic derivatives.

165. The computer program product of claim 164, wherein said fifth set of instructions comprises:

a first sub-set of instructions, executable on said computer system, configured to generate an integrated input signal by integrating said input signal; and a second sub-set of instructions, executable on said computer system, configured to sample said integrated input signal, said sampling resulting in said sampled input signal.

166. The computer program product of claim 162, wherein said chromatic expansion of said input signal is performed at a first time, said first time is before a second time, and said second time is at or before a time limit.

167. The computer program product of claim 166, wherein said value of said input signal is determined at a third time, and said third time is after said second time.

168. The computer program product of claim 166, wherein said chromatic derivatives are generated at said second time.

169. The computer program product of claim 168, frther comprising:

a fifth set of instructions, executable on said computer system, configured to perform a one-sided differentiation to generate said chromatic derivatives.

170. The computer program product of claim 166, wherein said chromatic derivatives are generated using values of said input signal up to said second time.

171. The computer program product of claim 166, wherein said chromatic derivatives are generated using values of said input signal up to a third time, said third time after said second time.

172. The computer program product of claim 171, wherein said third time is equal to said time limit.

173. The computer program product of claim 162, wherein said family of polynomials are orthonormal with respect to W, W is defined by $W(k,s_1,s_2)=1/(1+a(e(s_1)+e(s_2)))$, a is a constant, and e(t) is a function that describes a truncation error.

174. The computer program product of claim 162, wherein said determination is made by extrapolation and said extrapolation uses said chromatic derivatives.

175. An apparatus for predicting behavior of an input signal comprising:

means for defining a family of polynomials;

means for performing a chromatic expansion of said input signal, wherein said chromatic expansion results in a vector;

means for generating a plurality of chromatic derivatives using said vector and said input signal; and means for determining a value of said input signal using said chromatic derivatives.

176. The apparatus of claim 175, wherein said chromatic derivatives are generated by performing a one-sided differentiation.

177. The apparatus of claim 175, further comprising:

means for sampling said input signal, said sampling resulting in a sampled input signal; and means for using said sampled input signal in said generation of said chromatic derivatives.

178. The apparatus of claim 177, wherein said means for sampling comprises:

means for generating an integrated input signal by integrating said input signal; and means for sampling said integrated input signal, said sampling resulting in said sampled input signal.

179. The apparatus of claim 175, wherein said chromatic expansion of said input signal is performed at a first time, said first time is before a second time, and said second time is at or before a time limit.

180. The apparatus of claim 179, wherein said value of said input signal is determined at a third time, and said third time is after said second time.

181. The apparatus of claim 179, wherein said chromatic derivatives are generated at said second time.

182. The apparatus of claim 181, further comprising:

means for performing a one-sided differentiation to generate said chromatic derivatives.

183. The apparatus of claim 179, wherein said chromatic derivatives are generated using values of said input signal up to said second time.

184. The apparatus of claim 179, wherein said chromatic derivatives are generated using values of said input signal up to a third time, said third time after said second time.

185. The apparatus of claim 184, wherein said third time is equal to said time limit.

186. The apparatus of claim 175, wherein said family of polynomials are orthonormal with respect to W, W is defined by $W(k,s_1,s_2)=1/(1+a(e(s_1(+e(s_2))))$, a is a constant, and e(t) is a function that describes a truncation error.

187. The apparatus of claim 175, wherein said determination is made by extrapolation and said extrapolation uses said chromatic derivatives.

* * * * *